United States Patent [19]
Shakhman et al.

[11] Patent Number: 5,960,136
[45] Date of Patent: Sep. 28, 1999

[54] SHIELDED FIBER OPTIC CONNECTOR

[75] Inventors: Samuil Shakhman; Robert N. Schwartz, both of San Jose, Calif.

[73] Assignee: Hewlett-Packard Company, Palo Alto, Calif.

[21] Appl. No.: 08/986,438

[22] Filed: Dec. 8, 1997

[51] Int. Cl.⁶ .................................................. G02B 6/36
[52] U.S. Cl. ................................ 385/53; 385/54; 385/55; 385/89
[58] Field of Search ........................... 385/53–60, 71, 385/81, 89

[56] References Cited

U.S. PATENT DOCUMENTS 4,840,451  6/1989  Sampson et al. ....................... 385/89

*Primary Examiner*—Phan T. H. Palmer
*Attorney, Agent, or Firm*—Pamela Lau Kee

[57] ABSTRACT

A conductive shield is formed around a fiber-optic connector. The shield includes a compressible means that encircles the perimeter of the connector. When the connector is inserted, the compressible means electrically contact the chassis to prevent emissions through panel openings required by fiber-optic transceivers.

6 Claims, 7 Drawing Sheets

SHIELDED FIBER OPTIC CONNECTOR

FIELD OF THE INVENTION

The invention is directed towards telecommunication applications. In particular, the invention is directed towards the shielding of connectors used in fiber-optic applications.

BACKGROUND OF THE INVENTION

Historically, electrical connectors have been shielded to prevent emissions for signal wires and noise from external sources. Shielding has not been incorporated into fiber optic modules because the higher operating frequencies were believed to be immune from these effects. In reality, the fiber optic modules emit electromagnetic signals. In 47 CFR §15, the United States government has defined radiation emission regulations for commercial and consumer digital applications. For commercial applications, Class A, the radiation emission standards at frequencies above 1 Gbit/sec, at a distance of 3 m, the electrical field strength correlates to 46 dB/m. For consumer applications, Class B, the radiation emission standards at frequencies above 1 Gbit/sec, at a distance of 3 m, the electrical field strength is <500 $\mu$Volts/m or 54 dB $\mu$Volts/m. For many products, shielding is required to meet the FCC specifications.

When fiber optic connectors are inserted through panel openings of a chassis, the "window" that allows access to a module is larger than the module. Unwanted electrical transmissions can leak through the panel opening. As a result, fiber optic products often require customized shielding for each fiber optic component. Due to manufacturing tolerance, it is difficult to have the internal and external shields interface properly.

A uniform shielding for high-speed digital applications that is easy to manufacture and reliably eliminates unwanted electrical transmissions is desirable.

SUMMARY

A conductive shield is formed around a connector. The shield includes a compressible flange. When the connector is inserted into a panel opening of a chassis, the flange expands to prevent emissions from fiber-optic transceivers and other emissions sources within the housing.

DETAILED DESCRIPTION OF THE DRAWINGS

Figure 1:
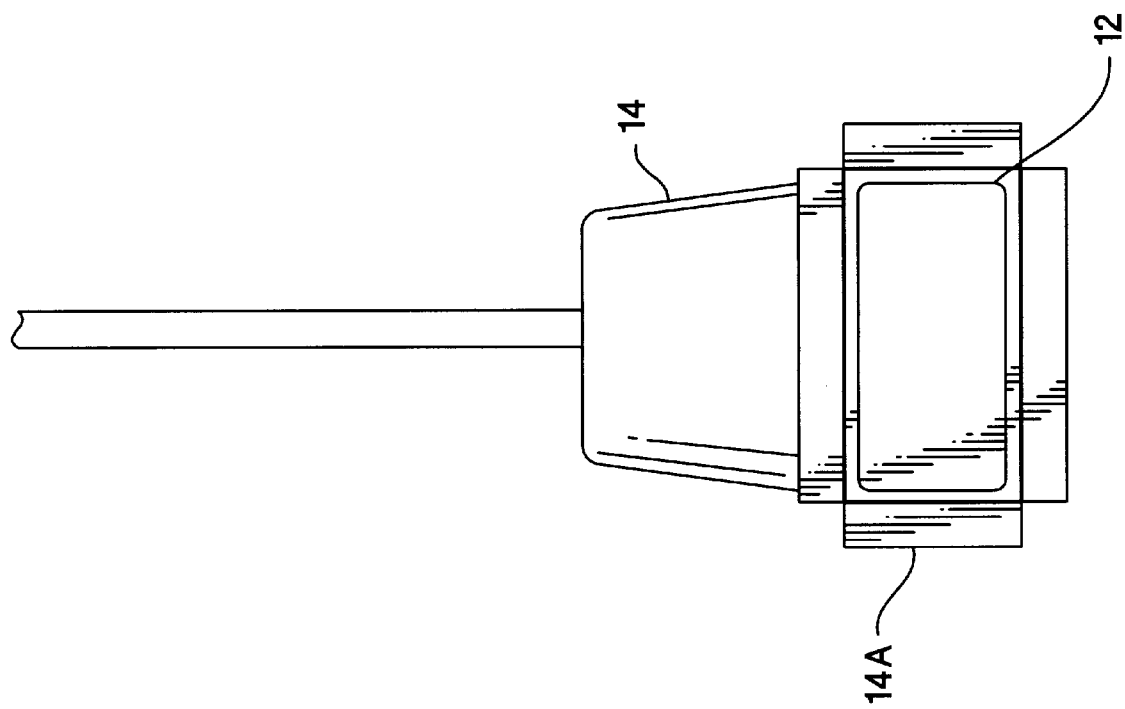
FIG. 1 illustrates a shielded connector of the present invention.

FIG. 1 illustrates a shielded connector 10. A connector 12 is surrounded by a conductive shell 14. The shell 14 includes a compressible flange 14A that extends past the connector. The flange 14A is shaped to block electrical emissions from the connector side of a chassis when the connector 10 is attached to a mating connector (not shown). The flange 14A abuts a chassis (not shown) when the connector 12 is inserted into a mating connector to electrically ground the housing. The grounded housing is the electrical shield for the connector 12.

Figure 2:
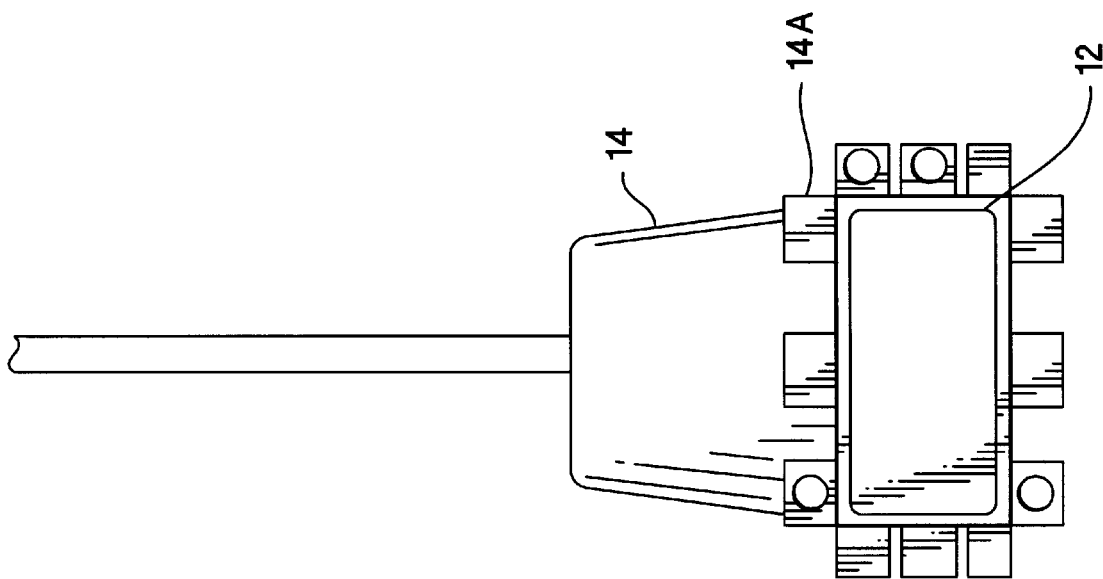
FIG. 2 illustrates an embodiment using metal fingers.

The flange 14A may have springy fingers as shown in FIG. 2. Several of the fingers may be fastened via solder, or secured, e.g. the fingers act as a washer and are screwed into the chassis to further improve the electrical connectivity.

Figure 3:
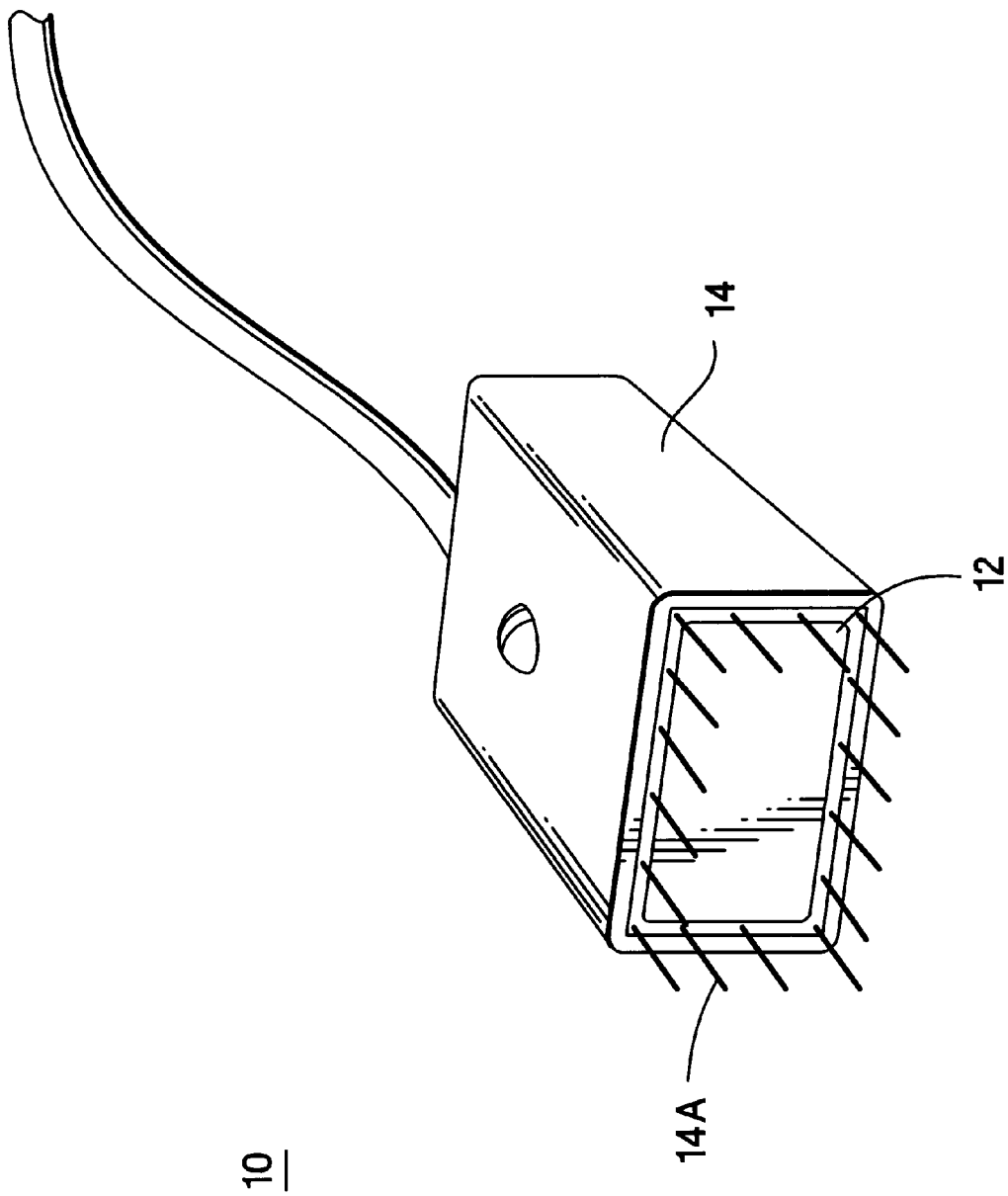
FIG. 3 illustrates an embodiment using pins

Alternatively, as shown in FIG. 3, pins 14A may be used in lieu of fingers.

Figure 4:
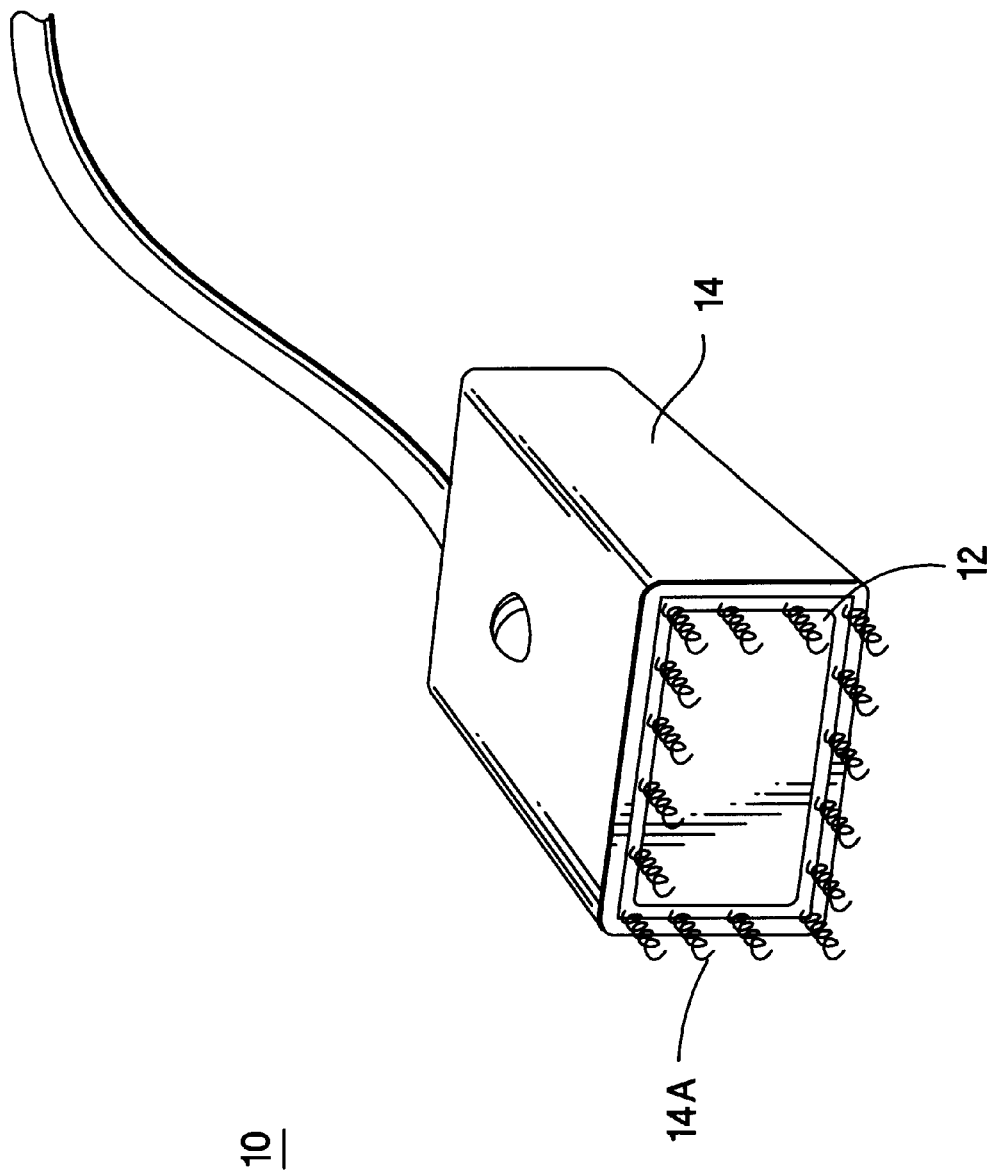
FIG. 4 illustrates an embodiment using conductive springs.

In FIG. 4, the fingers are replaced by conductive springs 12.

Figure 5A:
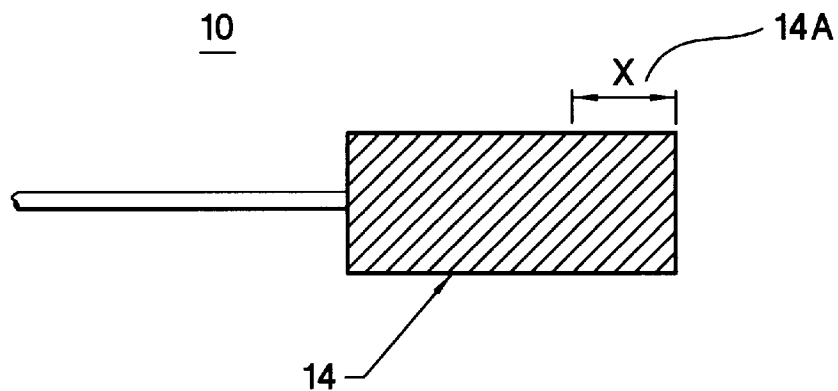
FIGS. 5A and 5B illustrate an embodiment having compressible flanges.
Figure 5B:
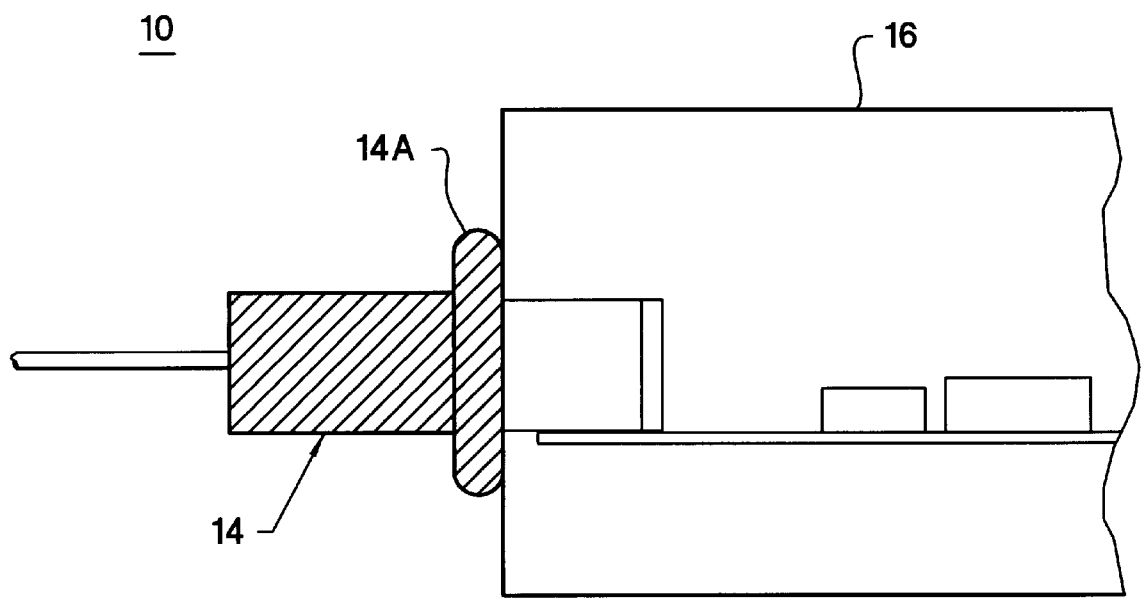

FIGS. 5A and 5B illustrate an embodiment 10 having a rigid shell 14 surrounding the connector 12 and a compressible flange 14A. When inserted into a mating optical fiber connector, as shown in FIG. 5B, the flange 14A compresses against the chassis 16 when inserted to form an electrical ground.

Figure 6:
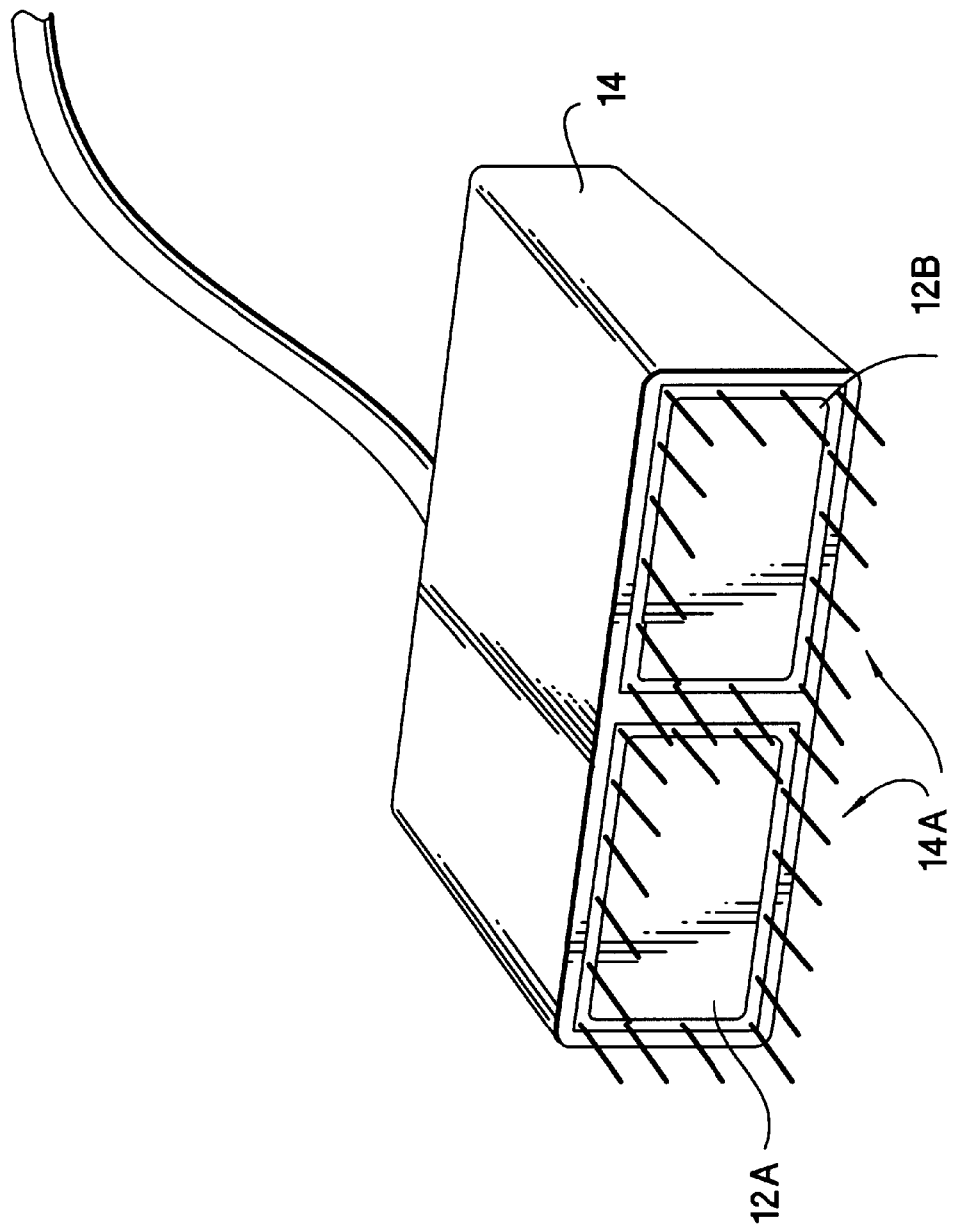
FIG. 6 illustrates a multiple connector embodiment.

In FIG. 6, a multiple connector embodiment, the emissions from within the chassis can be reduced by adding a metal finger 18 such that there is a metal frame, i.e. window pane, around each connector 12A, 12B.

Figure 7:
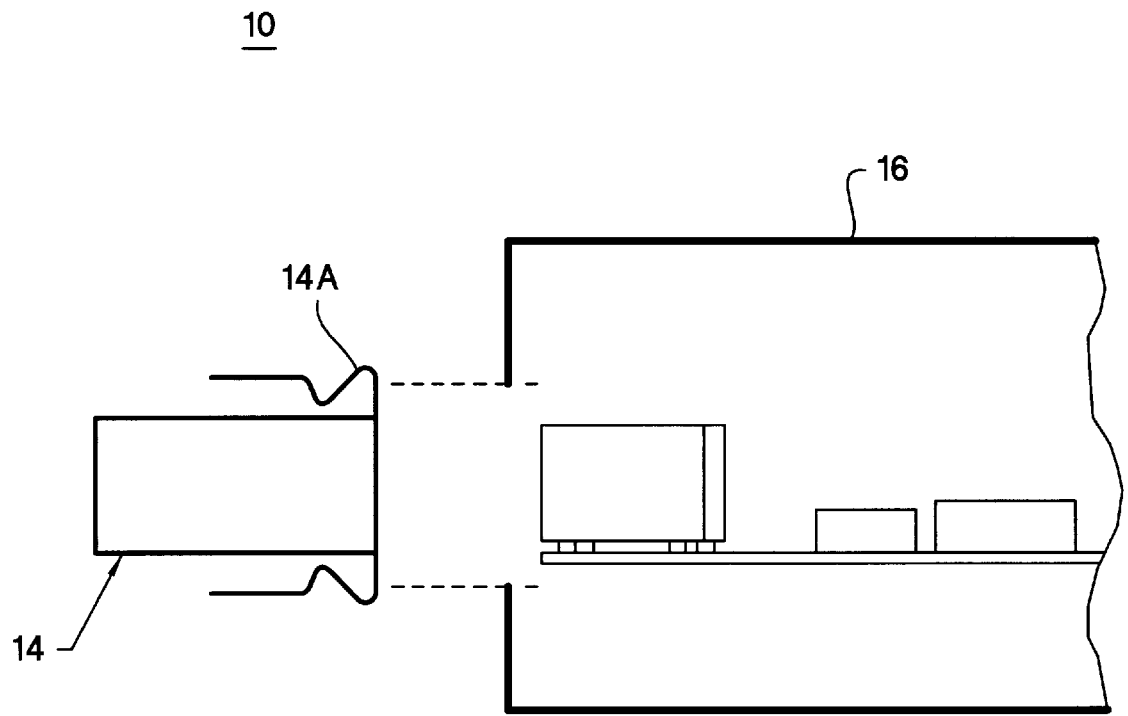
FIG. 7 illustrates an embodiment having levered fingers.

In FIG. 7, the tube 14 includes elongated bent fingers 14A. The tube 14 is slightly larger than the opening. When the elongated bent fingers 14A are compressed, the tube is temporarily reduced in size and can be inserted into a mating fiber optic connector 20. When the fingers 14A are released, the tube 14 expands within the panel opening to create an electrical ground.

We claim:

1. A shielded fiber optic connector, for preventing emissions through panel openings required by fiber transceivers mounted in a chassis comprising:

a fiber optic connector;

a conductive shell encasing the connector; and multiple spring contacts, attaching to the shell and surrounding the perimeter of the connector, that electrically connect to the chassis when the connector is inserted into one of the panel opening.

2. A shielded fiber optic connector, for preventing emissions through panel openings required by fiber optic transceivers mounted in a chassis comprising:

a fiber optic connector;

a conductive shell encasing the connector; and a tube having springy fingers, the fingers being distributed around the perimeter of the connector, for electrically contacting the chassis when the connector is inserted into one of the panel opening.

3. A shielded fiber optic connector, as defined in claim 2, further comprising a fastener, wherein the fastener is operative to attach at least one of the springy fingers to the chassis.

4. A shielded fiber optic connector, as defined in claim 2, wherein the springy fingers are compressible pins.

5. A shielded fiber optic connector, as defined in claim 2, wherein the springy fingers are conductive springs.

6. A shielded fiber optic connector, as defined in claim 2, wherein:

the tube is slightly larger than one of the panel openings; and at least one of the springy fingers is elongated and bent such that the perimeter of the tube is smaller than the opening when depressed to allow insertion into the panel opening and forms an electrical ground when the elongated fingers is released.

* * * * *